United States Patent [19] [11] 3,883,814
Weisenberger [45] May 13, 1975

[54] HIGH FIDELITY SOLID STATE MOBILE AMPLIFIER

[76] Inventor: Richard J. Weisenberger, 8 Kentaboo Dr., Erlanger, Ky. 41018

[22] Filed: May 1, 1974

[21] Appl. No.: 466,021

[52] U.S. Cl. ....................... 330/14; 330/13; 330/19; 330/59; 330/207

[51] Int. Cl. .............................................. H03f 3/04

[58] Field of Search ............. 330/14, 15, 13, 17, 18, 330/19, 59, 207 P

[56] References Cited

UNITED STATES PATENTS 3,185,934 5/1965 Patmore et al. ................. 330/207 P
3,379,986 4/1968 Leslie ............................... 330/17 X

*Primary Examiner*—R. V. Rolinec
*Assistant Examiner*—Lawrence J. Dahl
*Attorney, Agent, or Firm*—Melville, Strasser, Foster & Hoffman

[57] ABSTRACT

A high fidelity solid state mobile amplifier operating from a single-ended power source, having a transformerless output and adapted to amplify a grounded audio input signal. The input audio signal is applied to a voltage doubling driver circuit which is directly connected to a full-wave transistor bridge output stage. The latter stage directly drives a load without transformers or coupling capacitors.

18 Claims, 1 Drawing Figure

PATENTED MAY 13 1975
3,883,814
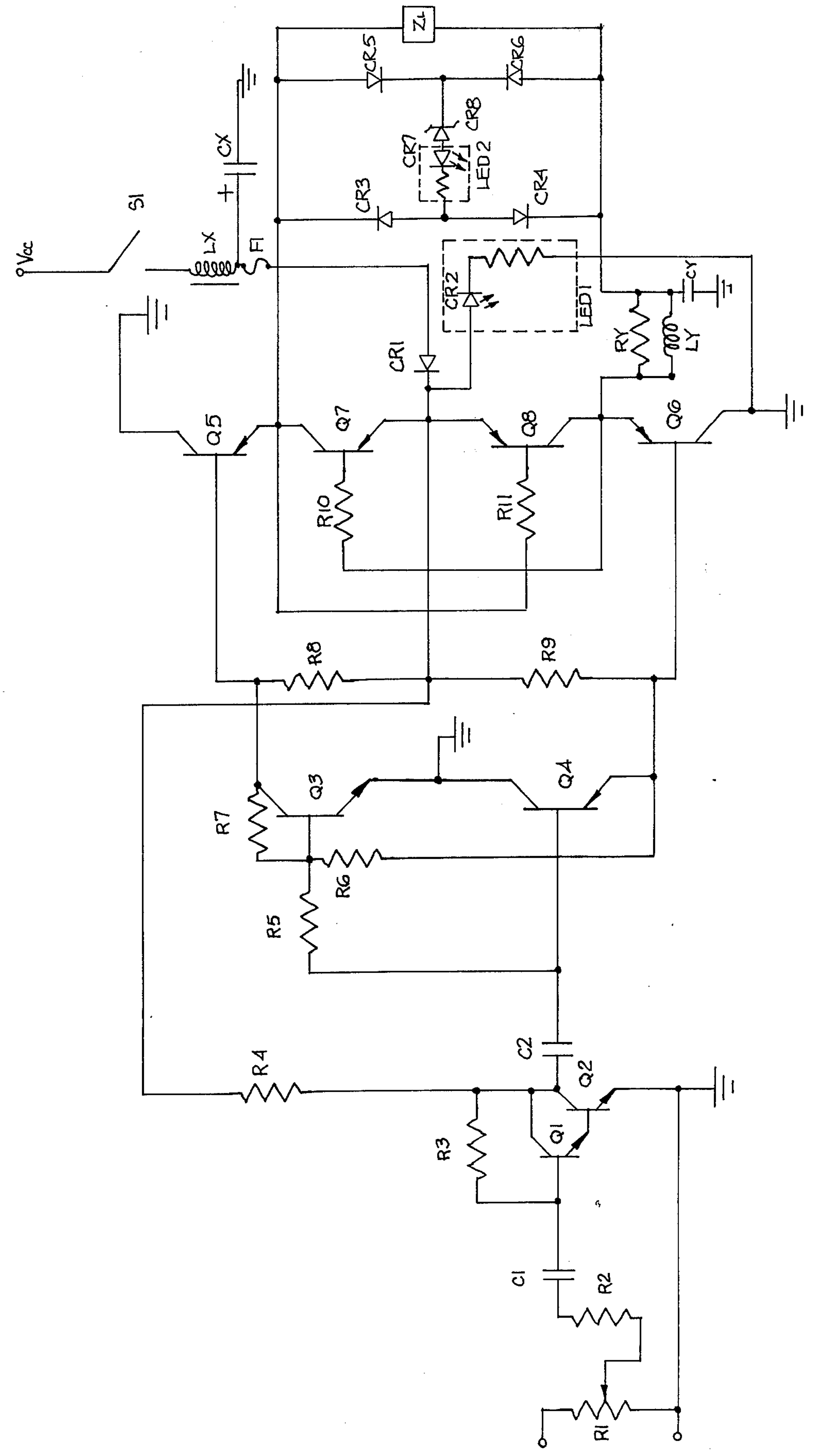

HIGH FIDELITY SOLID STATE MOBILE AMPLIFIER

BACKGROUND OF THE INVENTION

1. Field of the Invention

This invention relates to an audio amplifier for use with equipment in which it would be desirable to include an amplifier having high power, high gain, wide frequency response, low weight and occupying a minimum of space. For example, possible uses for an amplifier exhibiting these characteristics would include high quality mobile public address systems for sutomobiles and boats, extra high fidelity and powerful audio frequency sections for automobile radios and tape players, improved electronic megaphones and various other battery powered products. Furthermore, since the frequency response of the amplifier is essentially flat to 100 Khz, ultrasonic uses, such as depth and proximity sonar detection for small water craft, can be realized.

Accordingly, this invention discloses a method for amplifying a grounded audio input signal and a high fidelity solid state mobile amplifier operating from a single-ended power source having a transformerless output and adapted to amplify a grounded audio input signal. The amplifier functions in a Class A mode of operation to reduce crossover distortion.

2. Description of the Prior Art

Conventional transistorized power amplifiers operating from a single-ended power source typically utilize either output transformers with a primary impedence ¼ that of the secondary in order to maximize the power delivered to a load. The transformer is generally relatively large, rather heavy in weight and expensive to build in order that an acceptable frequency response may be achieved. Furthermore, the use of output transformers will inherently introduce some distortion into the output signal and will render the amplifier incapable of driving down to D.C. The use of transformers in the driver stage of the amplifier circuit produces essentially the same problems except that smaller transformers can be utilized.

Prior art power amplifiers also often employ large coupling capacitors to couple the amplifier output stage to the load. The use of large coupling capacitors results in disadvantages similar to those described above with respect to transformers.

Although transformerless power amplifiers operating from a single-ended power source have been designed to overcome the problems cited, these amplifiers have generally been either complex in circuit design or have exhibited other design deficiencies. See, for example, U.S. Pat. No. 3,379,986.

SUMMARY OF THE INVENTION

It is an object of the present invention to provide a direct coupled transformerless power amplifier operating from a single-ended power source and adapted to amplify a grounded input audio signal and a method of amplifying a grounded audio input signal utilizing a single-ended power source. That is, the amplifier of the present invention does not require a phase inverted floating ground input signal. It is also an objective of the present invention to provide an amplifier containing a minimum of components and similarly to minimize the necessity for transistor pairs exhibiting complementary symmetry characteristics. A final objective of the present invention is to provide an amplifier exhibiting Class A operating characteristics in order that low crossover distortion may be achieved.

Accordingly, the amplifier of the present invention comprises essentially an input driver stage cascaded with an output full wave transistor bridge stage. The input driver stage includes two input transistors of opposite conductivity while the transistor bridge stage includes four output transistors all of like conductivity.

The input audio signal is applied simultaneously and in phase to the bases of the two input transistors comprising the driver stage. During a first half cycle of the input signal an output signal from one of the input transistors causes one of the transistors of the bridge stage to conduct heavily. The latter transistor, in turn, causes a second transistor of the transistor bridge stage to similarly conduct heavily. As a result, essentially the full supply voltage will be impressed across the load in a predetermined direction.

During the second half cycle of the input signal the remaining input transistor will cause a third transistor of the transistor bridge stage to conduct heavily. The latter transistor will, in turn, cause the final transistor of the transistor bridge stage to similarily conduct heavily. As a result, essentially the full supply voltage will be impressed across the load in a direction opposite that occuring during the first half cycle of the input signal.

Therefore, essentially the full supply of voltage is being alternatively impressed across the load in both directions, instead of one direction, and the load is correspondingly experiencing a peak-to-peak voltage of up to twice the power supply voltage. The peak-to-peak voltage is limited to a degree by the small voltage drops across the conducting transistors. Consequently, an output power level of four times that of a conventional amplifier for the same supply voltage is impressed across the load.

BRIEF DESCRIPTION OF THE DRAWING

The drawing is an electrical schematic diagram showing the preferred embodiment of the present invention.

DESCRIPTION OF THE PREFERRED EMBODIMENTS

Turning now to a consideration of the details of the invention, it will be seen from the drawing that the input audio signal is impressed upon the amplifier by initial application thereof across tapped resistor R1. It is to be noted that tapped resistor R1 (volume control), resistor R2, capacitor C1, resistor R3, resistor R4 and transistors Q1 and Q2 comprise a Darlington common emitter preamplifier which, other than in association with the remainder of the amplifier does not form a part of this invention. The preamplifier is useful, however, as a matching impedence for the cascaded circuitry of the amplifier in that it presents a high input impedance, has a high gain figure and a low noise level. If, in a certain application, the Darlington common emitter preamplifier is omitted from the circuitry, the grounded input audio signal is conveniently applied to the amplifier through capacitor C2.

As discussed above, the circuitry following capicator C2 comprises the amplifier of the present invention. The input signal is applied through capicator C2 to the input driver stage of the amplifier comprising transistors Q3 and Q4 along with their associated biasing resitances. The biasing resistors for the input driver stage include resistors R5, R6 and R7. Biasing of the input driver stage transistors Q3 and Q4, as well as the remaining transistors in the amplifier circuit (i.e., Q5, Q6, Q7 and Q8), is far enough into the linear portions of the transistors' characteristic curves so as to eliminate any cross-over distortion (i.e., Class A. bias). D.C. energization of the entire amplifier is accomplished from Vcc through diode CR1. Diode CR1 provides polarity protection for the amplifier against possible damage from accidental reversing of power leads. Transistors Q3 and Q4 of the input driver stage, exhibit opposite conductivity characteristics (Q3 being an NPN transistor and Q4 being a PNP transistor) and are chosen so as to possess complementary symmetry. It is also to be noted that the emitter of transistor Q3 is directly connected to the collector of Q4, this connection being thereupon applied to ground.

As noted from the drawing, the input driver stage is directly coupled to a cascaded full wave transistor bridge stage. The transistor bridge stage comprises the four transistors Q5, Q6, Q7 and Q8 along with the associated biasing resistors R8, R9, R10 and R11. The transistors Q5, Q6, Q7 and Q8 comprising the transistor bridge, as mentioned above, are Class A biased so as to reduce cross-over distortion. Also, as mentioned above, diode CR1 polarity protects the transistor bridge stage against possible damage from accidental reversing of power leads. Since, as noted in the drawing, transistors Q5, Q6, Q7 and Q8 are of like conductivity (all being shown as PNP transistors) transistor selection for this stage of the amplifier can be easily and conveniently accomplished. Inter-connection of the transistor bridge stage is accomplished by grounding the collectors of transistors Q5 and Q6, directly interconnecting the emitters of transistors Q7 and Q8, connecting the collector of transistor Q7 to the emitter of transistor Q5 and connecting the collector of transistor Q8 to the emitter of transistor Q6. D.C. energization is applied through diode CR1 at the node formed by the connection between the emitters of transistors Q7 and Q8. The load to be driven by the amplifier is directly connected to the nodes formed by the connections between the emitter of transistor Q5 and collector of transistor Q7 and the emitter of transistor Q6 and collector of Q8. It is to be noted that although D.C. power does not flow through the load neither output terminal is at ground potential.

Operation of the amplifier of the present invention can be described as follows. The input audio signal is simultaneously applied through capicator C2 to the base of transistor Q4 and to the base of transistor Q3 through resistor R5. During the positive half cycle of the input audio signal the current at the collector of transistor Q3 will cause transistor Q5 of the full wave transistor bridge to conduct heavily. Heavily conducting transistor Q5 will, in turn, cause transistor Q8 of the full wave transistor bridge to similarly conduct heavily via the resistive coupling of resistor R11 from the emitter of transistor Q5 to the base of transistor Q8. Therefore, during the positive half cycle of the input audio signal the current path through the load $Z_L$ is from the supply of voltage $+Vcc$ to transistor Q8 through diode CR1, through the load $Z_L$, and then through transistor Q5 to ground.

During the negative half cycle of the input audio signal an identical procedure as described above with respect to transistors Q3, Q5 and Q8 occurs between transistors Q4, Q6 and Q7. That is, during the negative half cycle of the input audio signal the current at the emitter of transistor Q4 is applied to the base of transistor Q6 and thereby causes the latter transistor to conduct heavily. Heavily conducting transistor Q6 will, in turn, cause transistor Q7 to similarly conduct heavily through the resistive coupling of resistor R10 from the emitter of transistor Q6 to the base of transistor Q7. Therefore, during the negative half cycle of the input audio signal the current path through the load $Z_L$ is from $+Vcc$ to transistor Q7 through diode CR1, through the load $Z_L$, and then through transistor Q6 to ground. It is to be noted that the direction of current flow through the load $Z_L$ during the negative half cycle of the input audio signal is in a direction opposite that occuring during the positive half cycle.

As a result of the change in direction of current flow through the load $Z_L$ during alternate half cycles of the input audio signal the amplifier delivers to the load a peak-to-peak voltage of up to twice the supply voltage less the small voltage drops across the conducting transistors Q5, Q6, Q7 and Q8. Voltage doubling is thus achieved with a minimum of components (only six transistors being utilized), utilizing a single-ended power source and with a minimum of cross-over distortion due to the Class A biasing of the amplifier. Furthermore, the requirement for transistors exhibiting complementary symmetry requirements has been kept to a minimum.

The amplifier of the present invention has achieved excellent results with components in accordance with the values specified in Table 1 below. Typically, the amplifier will deliver a true 8 watts (RMS) into an 8 ohm load at just below the clipping point when powered by a 12 volt source, and peak power levels of 20 watts can be realized. An essentially flat frequency response is typically obtainable over the range of 20 hz–100khz ± 1.0db at full power with an excellent signal-to-noise ratio of 90db.

TABLE 1

| CIRCUIT PARAMETER | VALUE OR TYPE |
|---|---|
| R1 | 50 Kohm |
| R2 | 3.9 Kohm |
| R3 | 750 Kohm |
| R4 | 150 ohm |
| R5 | 19 Kohm |
| R6 | 22 Kohm |
| R7 | 82 Kohm |
| R8 | 560 ohm |
| R9 | 560 ohm |
| R10 | 330 ohm |
| R11 | 330 ohm |
| $Z_L$ | 8 ohm |
| C1 | 1 micro farad |
| C2 | 1 micro farad |
| Q1 | HEP 736 |
| Q2 | HEP 53 |
| Q3 | HEP 736 |
| Q4 | HEP 715 |
| Q5, Q6, Q7, Q8 | HEP 700 |
| CR1 | HEP 161 |
| CR2, CR7 | HEP P 2001 [res. with LED 1 300Ω res. with LED 2 100Ω] |
| Cr3, CR4, CR5, CR6 | HEP 154 |
| CR8 | HEP 103 |
| RY | 10 ohm 2 watt |
| CX | 2,000 microfards, 15 volts |
| CY | .1 microfards |
| LX | |
| LY | No. 26 wire wrapped around RY |
| Vcc | 12 volts |
| F1 | 2.5 amp. |

In addition to the options already mentioned, that is, the use of a Darlington common emitter preamplifier stage and the diode CR1 to provide polarity protection for the amplifier, several additional options may be incorporated into the amplifier to enhance its performance. For example, to eliminate spark-plug noise (when the amplifier is used in automobiles) and also to supress transient click at turn on, LC filtering in the V*cc* line similar to that used in present automobile radios may be utilized. Optional LC filtering and decoupling is incorporated into the amplifier as shown in the diagram by inductance LX and capacitance CX. Also shown in the V*cc* line of the amplifier is an optional switch S1 which can be utilized to turn the amplifier off and on and a fuse F1 having a 2½ ampere rating for the component values shown in Table I.

Another useful option is shown in the diagram by the monitoring device placed across the amplifier output and comprising diodes CR3, CR4, CR5 and CR6, light emitting diode LED 2 (shown schematically as comprising a diode CR7 and an associated series resitor) and zener diode CR8. The purpose of the monitoring device is to indicate when the amplifier is being driven to the clipping point. During the positive half cycle of the input audio signal, when transistors Q5 and Q8 are conducting heavily, voltage will be applied through diode CR6 to the zener diode CR8. Zener diode CR8, which should be selected so as to have a break down voltage of approximately 6 volts under the power supply voltage Vcc, will conduct when the voltage across the load $Z_L$ exceeds its break-down voltage thereby causing light emitting diode LED 2 to conduct and become illuminated which serves to indicate that the amplifier is being driven beyond its clipping point. Similarly, during the negative half cycle of the input audio signal and when transistors Q6 and Q7 are conducting heavily, the voltage impressed across the load will be applied to zener diode CR8 through diode CR5. Again, whenever the voltage exceeds the break-down voltage of zener diode CR8, conduction through zener diode CR8 will occur and light emitting diode LED 2 will illuminate indicating that the amplifier is being driven beyond its clipping point.

Another option is shown by the power monitor comprising light emitting diode LED 1. As shown in the drawing light emitting diode LED 1 comprises diode CR2 and an associated series resistance. Light emitting diode LED 1 is connected so as to sample power supply voltage VCC and to be illuminated thereby indicating the presence of power in the amplifier.

Finally, as is well known in the art, a grounded RLC circuit may be inserted in the output line to stabilize the amplifier against oscillation, when inductive output loads are utilized. Accordingly, a grounded RLC circuit, comprising of resistor RY, inductor LY and capacitor CY, is shown in the drawing between the node formed by the emitter of transistor Q6 and the collector of transistor Q8 and the cathode of diode CR4.

It will, of course, be understood that the description herein of the preferred embodiment of the invention is intended as exemplary only and not to impose any limitations on the invention. Accordingly, enumerable changes may be made in the values of circuit paramaters listed in Table I above without changing the basic operation or design of the circuit.

The embodiments of the invention in which an exclusive property or privilege is claimed are defined as follows:

1. A method of amplifying a grounded audio input signal utilizing a single-ended power source and no transformers including the steps of;

a. simultaneously applying said grounded audio input signal to the bases of first and second input transistors, said first and second input transistors being of opposite conductivity and having the emitter of said first input transistor connected to the collector of said second input transistor at a reference potential;

b. the outputs on the collector and emitter of respectively said first and second input transistors being then applied to a full wave transistor bridge stage including four transistors of like conductivity with respect to said second input transistor;

c. said output on said collector of said first input transistor controlling, by application thereof to the base of a first transistor of said transistor bridge whose collector is at a reference potential, the state of said first transistor of said transistor bridge;

d. said first transistor of said transistor bridge controlling, in turn, the state of a second transistor of said transistor bridge by application of a signal from the emitter to the base respectively of said first and second transistors of said transistor bridge;

e. said output on said emitter of said second input transistor controlling, by application thereof to the base of a third transistor of said transistor bridge whose collector is at reference potential, the state of said third transistor of said transistor bridge;

f. said third transistor of said transistor bridge controlling, in turn, the state of a fourth transistor of said transistor bridge by application of a signal from the emitter to the base respectively of said third and fourth transistors of said transistor bridge, wherein g. the emitters of said second and fourth transistors of said transistor bridge are connected together forming a first node, said first node being in electrical communication with said single-ended power source and with a resistive means connected in parallel with respect to said collector of said first input transistor and said emitter of said second input transistor, the collectors of said second and fourth transistors of said transistor bridge being connected to respectively the emitters of said third and first transistors of said transistor bridge forming second and third nodes;

h. the outupt of said transistor bridge being then applied to a lead connected across said second and third nodes.

2. The method of amplifying an audio signal in accordance with claim 1, wherein said first input transistor is an NPN transistor and said second input transistor and said four transistors comprising said full wave transistor bridge stage are PNP transistors.

3. The method of amplifying an audio signal in accordance with claim 1, wherein said first and second input transistors and said four transistors comprising said full wave transistor bridge stage are biased for class A operation.

4. The method of amplifying an audio signal in accordance with claim 1, wherein said grounded audio input signal is impressed upon a Darlington common emitter preamplifier stage prior to said simultaneous application thereof to said bases of said first and second input transistors.

5. The method of amplifying an audio signal in accordance with claim 1, wherein a monitoring device is connected across said second and third nodes to indicate when said output of said transistor bridge has reached its clipping point.

6. The method of amplifying an audio signal in accordance with claim 5, wherein said monitoring device comprises a diode bridge rectifier circuit, the bridge branch thereof including a light emitting diode connected in series with a zener diode.

7. The method of amplifying an audio signal in accordance with claim 1, wherein a light emitting diode is connected from said first node to said reference potential to indicate the presence of D.C. power.

8. The method of amplifying an audio signal in accordance with claim 1, wherein a filter is intermediate said single-ended power source and said first node, said filter comprising an inductance in series with said single-ended power source and said first node and a capacitance communicating with said first node and said reference potential.

9. The method of amplifying an audio signal in accordance with claim 1 wherein a diode is intermediate said first node and said single-ended power source.

10. A direct coupled transformerless power amplifier operating from a single-ended power source and adapted to amplify a grounded input audio signal, said amplifier comprising:

a. a full wave transistor bridge circuit including four transistors of like conductivity;

b. a first pair of said four transistors having their emitters connected together at a first node, said first node being in electrical communication with said single-ended power source;

c. a second pair of said four transistors each having its collector connected to a reference potential wherein the collectors of said first pair of said four transistors are connected respectively to the emitters of said second pair of said four transistors, said connections defining second and third nodes;

d. said second node being in electrical communication via first resistive means with the base of the transistor of said first pair of said four transistors whose collector terminates in said third node, said third node being in electrical communication via second resistive means with the base of the transistor of said first pair of said four transistors whose collector terminates in said second node;

e. a load connected across said second and third nodes to receive the output of said transistor bridge circuit;

f. an input driver stage including first and second input transistors of opposite conductivity the emitter of said first input transistor and the collector of said second input transistor being connected together at said reference potential;

g. the collector of said first input transistor being connected to the base of the transistor of said second pair of said four transistors whose emitter terminates in said second node, via third resistive means to said first node and via fourth resistive means to its base, and the emitter of said second input transistor being connected to the base of the transistor of said second pair of said four transistors whose emitter terminates in said third node and via fifth resistive means to said first node; and h. the base of said first input transistor being connected via resistive means to the base of said second input transistor and the bases of said first and second input transistors in electrical communication with said ungrounded audio input signal.

11. The amplifier in accordance with claim 10, wherein said first input transistor is an NPN transistor and said second input transistor and said four transistors comprising said full wave transistor bridge circuit are PNP transistors.

12. The amplifier in accordance with claim 10, wherein said first and second input transistors and said four transistors comprising said full wave transistor bridge circuit are biased for class A operation.

13. The amplifier in accordance with claim 10, wherein a Darlington common emitter preamplifier stage immediately precedes said input driver stage.

14. The amplifier in accordance with claim 10, wherein a monitoring device is connected across said second and third nodes to indicate when said output of said transistor bridge circuit has reached its clipping point.

15. The amplifier in accordance with claim 14, wherein said monitoring device comprises a diode bridge rectifier circuit, the bridge branch thereof including a light emitting diode connected in series with a zener diode.

16. The amplifier in accordance with claim 10, wherein a light emitting diode is connected from said first node to said reference potential to indicate the presence of D.C. power.

17. The amplifier in accordance with claim 10 wherein a filter is intermediate said single-ended power source and said first node, said filter comprising an inductance in series with said single-ended power source and said first node and a capacitance communicating with said first node and said reference potential.

18. The amplifier in accordance with claim 10, wherein a diode is intermediate said first node and said single-ended power source.

* * * * *